(12) United States Patent
Ikeda et al.

(10) Patent No.: US 8,728,340 B2
(45) Date of Patent: May 20, 2014

(54) METHOD FOR MANUFACTURING THERMOELECTRIC MATERIAL

(75) Inventors: Teruyuki Ikeda, Kawaguchi (JP); G. Jeffrey Snyder, Pasadena, CA (US)

(73) Assignees: Japan Science and Technology Agency (JP); California Institute of Technology, Pasadena, CA (US)

( * ) Notice: Subject to any disclaimer, the term of this patent is extended or adjusted under 35 U.S.C. 154(b) by 163 days.

(21) Appl. No.: 13/431,107

(22) Filed: Mar. 27, 2012

(65) Prior Publication Data
US 2013/0153811 A1 Jun. 20, 2013

Related U.S. Application Data

(60) Provisional application No. 61/578,083, filed on Dec. 20, 2011.

(51) Int. Cl.
*H01L 35/32* (2006.01)
*H01L 35/14* (2006.01)
*H02N 11/00* (2006.01)

(52) U.S. Cl.
USPC .............. 252/62.3 T; 75/255; 419/32; 419/66

(58) Field of Classification Search
USPC .................. 252/62.3 T; 75/255; 419/32, 666; 136/236.1–241
See application file for complete search history.

(56) References Cited

U.S. PATENT DOCUMENTS

| 7,365,265 B2 * | 4/2008 | Heremans et al. | 136/238 |
| 7,847,179 B2 * | 12/2010 | Kanatzidis et al. | 136/201 |
| 2013/0180561 A1 * | 7/2013 | Snyder et al. | 136/203 |

FOREIGN PATENT DOCUMENTS

| JP | 06-081076 | 3/1994 |
| JP | 09-020512 | 1/1997 |
| JP | 2002-353526 | 12/2002 |
| JP | 2004-289045 | 10/2004 |
| JP | 2009260173 | 11/2009 |
| JP | 2011-210870 | 10/2011 |
| JP | 2012-244001 | 12/2012 |

OTHER PUBLICATIONS

Heremans et al, "Thermopower enhancement in PbTe with Pb precipitates", Jour. App. Phys., 98, Sep. 2005, pp. 063703-1 to 063703-6.*
Androulakis et al, "Spinodal Decomposition and Nucleation and Growth as a Means to Bulk Nanostructured Thermoelectrics: Enhanced Performance in Pb 1-xSnxTe-PbS", J. Am. Chem. Soc., 129, Jul. 2007, pp. 9780-9788.*
Androulakis, J. et al. Spinodal Decomposition and Nucleation and Growth as a Means to Bulk Nanostructured Thermoelectrics: Enhanced Performance in Pb1-xSnxTe-PbS. *J. Am. Chem. Soc.* 2007, 129:9780-9788.
Ikeda, T. et al. Formation of $Sb_2Te_3$ Widmanstätten precipitates in thermoelectric PbTe. *Acta Materialia.*, 2009. 57:666-672.
Ikeda, T. et al. Size control of $Sb_2Te_3$ Widmanstätten precipitates in thermoelectric PbTe. *Acta Materialia.*, 2011. 59:2679-2692.
Ikeda, T. et al. Self-Assembled Nanometer Lamellae of Thermoelectric PbTe and $Sb_2Te_3$ with Epitaxy-like Interfaces. *Chem. Mater.* 2007, 19,763-767.
Turnbull, D. Metastable Structures in Metallurgy. *Metallurgical Transactions A.* 1981. 12A:695-708.
Bergum, K., et al., Solubility and microstructure in the pseudo-binary PbTe—Ag2Te system, J. Solid State Chem. 2011, 184: 2543-2552.
Hsu, K., et al., Cubic $AgPbmSbTe_{2+}m$: Bulk Thermoelectric Materials with High Figure of Merit, Science 2004, 303: 818-821.
Suryanarayana, C., Solid Solubility Extensions, in Mechanical Alloying & Milling 2004, Chap. 9, Marcel Decker, pp. 139-182.
International Search Report for PCT/JP2012/082782 filed on Mar. 27, 2012 mailed on Mar. 26, 2013.
English text of Notice of Reasons for Rejection mailed on Nov. 26, 2013 for Japanese Application 2013-540140 filed on Mar. 27, 2013 in the name of Japan Science & Technology Agency et al., Dec. 18, 2012.

* cited by examiner

*Primary Examiner* — Carol M Koslow
(74) *Attorney, Agent, or Firm* — Steinfl & Bruno, LLP (57) ABSTRACT

The method of manufacturing the thermoelectric material including a plurality of phases that are phase-separated from a supersaturated solid solution includes: a process of performing a mechanical alloying treatment to a starting raw material that is prepared with a composition deviated from a composition range existing in an equilibrium state of a compound to generate the supersaturated solid solution; and a process of performing phase separation into the plurality of phases and solidification by heating and pressing the supersaturated solid solution, or by further performing a heat treatment according to the circumstances.

5 Claims, 4 Drawing Sheets

METHOD FOR MANUFACTURING THERMOELECTRIC MATERIAL

CROSS-REFERENCE TO RELATED APPLICATIONS

This application claims benefit from U.S. Provisional application Ser. No. 61/578,083, filed Dec. 20, 2011, the contents of which are incorporated herein by reference.

FIELD OF THE INVENTION

The present invention relates to a method of manufacturing a thermoelectric material including a plurality of phases that are phase-separated from a supersaturated solid solution, a thermoelectric material, and a thermoelectric conversion element using the thermoelectric material.

DESCRIPTION OF RELATED ART

A thermoelectric conversion element (thermoelectric element or thermoelectric device) is an element capable of performing conversion between thermal energy and electric energy. For example, in the case of an element converting thermal energy to electric energy, this thermoelectric conversion element is expected to perform an important role in solving energy problems, because this conversion element is capable of converting exhaust heat discharged from a device provided with this conversion element to power (for example, Patent Document 1).

Thermal conversion efficiency of the thermal conversion element is a simple function of the thermoelectric figure of merit $zT=S^2\sigma T/k$ (where, S represents the Seebeck coefficient, $\sigma$ represents electric conductivity, k represents thermal conductivity (which is expressed by $k=k_{el}+k_{ph}$ (where, $k_{el}$ and $k_{ph}$ represent thermal conductivities due to electrons and lattices (phonons), respectively), and T represents measured temperature)). The higher zT is, the higher the conversion efficiency is. Since zT is an amount determined by a material (thermoelectric material) that is used for the thermoelectric conversion element, a thermoelectric material showing a high zT is being demanded to be developed. To raise zT, it is necessary to raise the power factor $S^2\sigma$ or to decrease the thermal conductivity k.

In recent years, it is recognized that if a nanostructure is formed in the thermoelectric material using various phase transformations and thus the high density of interface is introduced into that, the lattice (phonon) thermal conductivity can be decreased rapidly, and thus the formation of a nanostructure is recognized as powerful means for raising the thermoelectric figure of merit. Therefore, the research on microstructure in the bulk thermoelectric material has been growing rapidly. Nanostructure has typically been introduced by utilizing diffusive phase transformations such as solid-state precipitation (for example, Non-Patent Documents 1 and 2), spinodal decomposition (for example, Non-Patent Document 3), and a eutectoid reaction (for example, Non-Patent Document 4). Whether or not these sorts of phase transformations can be utilized is dependent on equilibrium phase diagrams. Therefore, in a case where a stable phase does not vary with temperature, or a solid-solubility does not vary with temperature (for example, a line compound: a compound that exists only in the vicinity of a stoichiometric composition and changes to a two-phase mixed state when a composition is slightly deviated from the vicinity), a solid-state phase transformation may not be used. In order to introduce nanostructure in such compounds using the solid-state phase transformations, a material needs to be made in a nonequilibrium state such as amorphous, supersaturated solid solution, etc.

[Patent Document 1] Japanese Unexamined Patent Application Publication No. 2009-260173

[Non-Patent Document 1] Ikeda, T. et al., Acta Mater. 2009, 57, 666-672.

[Non-Patent Document 2] Ikeda, T. et al., Acta Mater. 2011, 59, 2679-2692.

[Non-Patent Document 3] Androulakis, J. et al., J. Am. Chem. Soc. 2007, 129, 9780-9788.

[Non-Patent Document 4] Ikeda, T. et al., Chem. Mater. , 2007, 19, 763-767.

[Non-Patent Document 5] Suryanarayana, C., Mechanical alloying and milling, Marcel Dekker: New York, 2004.

[Non-Patent Document 6] Turnbull, D. Metallurgical Transactions A, 1981, 12A, 695-708.

Rapid solidification (RS) is one of the promising techniques to realize nonequilibrium states of materials, and is frequently used for commercial products, typically for metallic alloys. Indeed, the rapid solidification has been studied for thermoelectric materials such as $(Bi-Sb)_2Te_3$, skutterudite, $AgSbTe_2$, and MnSi, promising results have been obtained. On the other hand, a mechanical alloy (MA) can also realize nonequilibrium states of materials in various forms (for example, Non-Patent Document 5). The nonequilibrium states can be solid-solutions with extended solubilities (for example, Non-Patent Document 5): examples include an Ag—Cu system, which shows a typical eutectic phase diagram in equilibrium forms, but a solid solution at the entire composition range by a mechanical alloying, and an Ag—Fe system, where the constituent elements are even repulsive to each other but the solubilities of the both end members are significantly extended by the mechanical alloying. There have been few studies of the mechanical alloying for nano-structuring thermoelectric materials via the nonequilibrium state. Here, the rapid solidification and the mechanical alloying, which are methods of leading the thermoelectric material to the nonequilibrium state, will be compared to each other.

According to Turnbull (Non-Patent Document 6), the core concept for bringing a material to the nonequilibrium state are "energize and quench".

Figure 1:
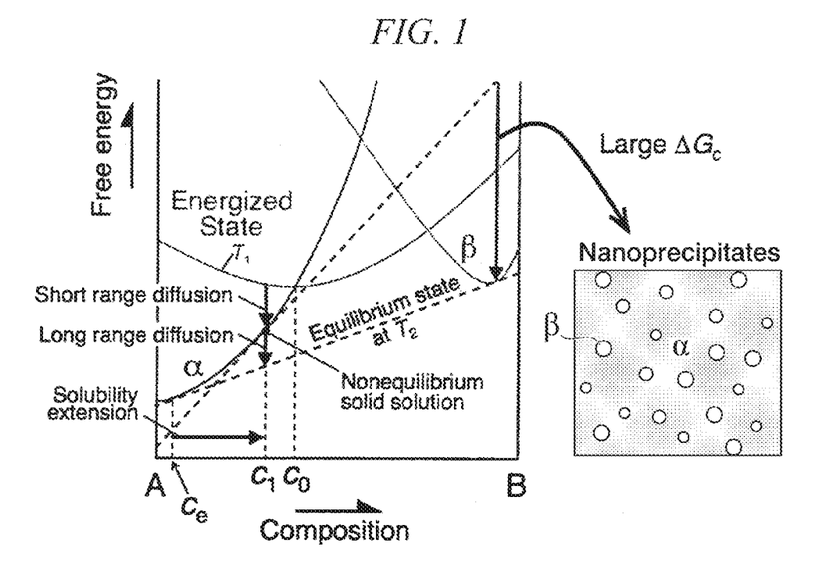
FIG. 1 is a conceptual view of a free energy curve of a material system including two components A and B.

FIG. 1 shows the schematic diagram of the free energy curves in the material system composing two components A and B at a temperature $T_1$, to which the material of the composition $C_1$ is quenched in the rapid solidification, or at which the mechanical alloying is performed.

In FIG. 1, the uppermost line (a line indicated by $T_1$) shows an energized state where the configuration of atoms is assumed to be similar to a molten state for the rapid solidification and amorphous or severely deformed, a atomized state, or a fractured state occurring in a very limited portions of the sample in the mechanical alloying state; but the atomic vibration amplitude is that at $T_1$.

In a rapid solidification process, during the quenching to a low temperature, some relaxation of the atom configuration may occur. The atom configuration may be relaxed by short range atomic diffusion (FIG. 1) to a αphase state giving a supersaturated solid-solution with solubility $c_1$ extended from the equilibrium solubility $c_e$. Depending on the cooling rate, a further relaxation may cause a phase separation to $\alpha+\beta$, which requires a long-range atomic diffusion (FIG. 1), during the cooling. $c_0$ is the maximum possible solubility in α phase, before the amorphous (energized) state becomes more stable. $c_0$ increases with decreasing temperature. To obtain a solid-solution with composition greater than $c_0$ by the rapid solidification, the temperature to which a sample is quenched needs to be reduced. The resultant state after the quenching depends on the cooling rate, which is largely governed by the thermal conductivity of the material.

In a mechanical alloying process, the material is brought into the energized state in a very limited region of the sample because of the collision of the material with the milling medium and container walls. Because of the large number of collisions during the mechanical alloying, the entire sample is gradually transitioned to an energized state, but at different times. Depending on the mechanical energy applied to the sample, the location of the curve for the energized state may vary relative to those of the $\alpha$ and $\beta$ phases and can be higher than the amorphous state obtained by the rapid solidification because of the large surface area of powder prepared by the mechanical alloying. This is one of the reasons why the mechanical alloying can realize nonequilibrium states for the metallic alloy better than the rapid solidification. Short range relaxation may occur immediately after the collision process during MA. In the mechanical alloying process at room temperature, quenching is not required and the relaxation should be limited to the short range diffusion since the atomic diffusion length is small. In general, excellent thermoelectric materials have low thermal conductivities (typically, in the order of magnitude of 1 $Wm^{-1}K^{-1}$) to show high zT, and hence has a heat conduction ability much lower than that of metal (typically, ~10 to $10^2$ $Wm^{-1}K^{-1}$) or a metallic alloy (typically, ~10 $Wm^{-1}K^{-1}$). Therefore, particularly, in thermoelectric materials with the thermal conductivities which limit the cooling rate in the rapid solidification process, the mechanical alloying could quench nonequilibrium states unobtainable by the rapid solidification at typical sample sizes.

If the $\alpha$ phase shows a limited solubility (low $c_e$), the free energy curve should steeply increase with the increase in B content. Therefore, in order to realize a nonequilibrium solid-solution of such a compound at a certain composition $c_1$, the energized state needs to be located at high energy. On the other hand, once such a highly energized state is achieved, the chemical driving force is expected to be large to get the material to the equilibrium state by the post heat treatment at $T_2$ ($>T_1$) ("long range" step in FIG. 1). In terms of reducing $k_{ph}$ of the thermoelectric material, a large chemical driving force of the phase transformation is preferable since it leads to a high nucleation rate of the phase transformation according to a classical nucleation theory, and therefore should result in fine microstructure. In order to realize the nonequilibrium states of the thermoelectric material with limited equilibrium solubilities and low thermal conductivities, the rapid solidification may not be able to make a state at an energy level state high enough to exceed the energy for the nonequilibrium solid-solution or have a cooling rate high enough to quench the high energy state. From this point of view, the mechanical alloying is more advantageous to realize nonequilibrium solid solution of thermoelectric materials with limited equilibrium solubilities, such as $Mg_2Si$.

Until now, the mechanical alloying has been used in the synthesis (a compound synthesis starting from constituent elements) of a thermoelectric material as a process in which a melting process is not necessary to be performed. However, by using the fact in which the mechanical alloying provides high energy to a material, that is, makes it in the nonequilibrium state, an invention in which nanostructures are introduced to the thermoelectric material is presented for the first time.

Another characteristic of the mechanical alloying is in that it does not undergo the melting process. This advantage has been used in the synthesis of the thermoelectric material until now as a compound synthesis process that does not undergo the melting process, and this is reflected as it is on the present invention. A difference of the compound synthesis process via the mechanical alloying from a simple compound synthesis process is in that a composition is not limited to a stoichiometric composition to introduce nanostructures, and relative high energy needs to be applied so as to obtain a nonequilibrium state and then the nanostructures are obtained by a post heat treatment.

An object of the invention is to provide a method of manufacturing a thermoelectric material with a high thermoelectric figure of merit, the thermoelectric material, and a thermoelectric conversion element using the thermoelectric material.

SUMMARY OF THE INVENTION

To accomplish the above-described object, the present invention provides means described below.

(1) According to an aspect of the invention, there is provided a method of manufacturing a thermoelectric material including a plurality of phases that are phase-separated from a supersaturated solid solution. The method includes: a process of performing a mechanical alloying treatment to a starting raw material that is prepared with a composition deviated from a composition range existing in an equilibrium state of a compound to generate the supersaturated solid solution; and a process of causing a phase separation to the plurality of phases and solidification by heating and pressing the supersaturated solid solution, or by further performing a heat treatment to the supersaturated solid solution according to circumstances.

Here, "phase" may be a phase of a nanometer size (nanostructure). In addition, "a phase separation to the plurality of phases and solidification by heating and pressing the supersaturated solid solution, or by further performing a heat treatment to the supersaturated solid solution according to circumstances" represents that "a phase separation to the plurality of phases and solidification by heating and pressing the supersaturated solid solution" or "a phase separation to the plurality of phases and solidification by heating and pressing the supersaturated solid solution and by further performing a heat treatment to the supersaturated solid solution", and "further performing a heat treatment according to the circumstances" may be appropriately performed in a case where a person of ordinary skill in the art determines that the phase separation into the plurality of phases or the solidification (any one of "phase separation", "solidification", and "phase separation and solidification") is not sufficient according to the heating and pressing, or the like.

(2) In the method of manufacturing a thermoelectric material according to (1), the mechanical alloying treatment may be performed until a compulsory solid solution state of the starting raw material including a component of any phase among the plurality of phases is realized.

(3) In the method of manufacturing a thermoelectric material according to (1) or (2), the phase separation from the solid solution state may be caused by the heating and pressing or by further an additional heat treatment according to circumstances.

(4) In the method of manufacturing a thermoelectric material according to any one of (1) to (3), the compound may be any one selected from a group consisting of $Mg_2Si$, Si—Ge, Fe—Si, Mn—Si, Cr—Si, PbTe (Te is partially or entirely substitutable with S or Se), GeTe, $AgSbTe_2$, $CoSb_3$, $AM_4Sb_{12}$ (A is an alkali metal, alkali earth metal, rare-earth metal, Ga, In, or Tl; M is Fe, Co, or Ni; Sb can be doped with Ga, In, Ge, Te, Sn, As, Se, or Bi), $Bi_2Te_3$ (Bi is partially substitutable with Sb), ZnSb, $Zn_4Sb_3$, $AZn_2Sb_2$ (A is an alkali metal, alkali earth metal, rare-earth metal, Ga, In, or Tl; M is Fe, Co, or Ni), $A_3MSb_3$ (A is an alkali metal, alkali earth metal, rare-earth metal, Ga, In, or Tl; M is Fe, Co, or Ni), $A_5M_2Sb_6$ (A is an alkali metal, alkali earth metal, rare-earth metal, Ga, In, or Tl; M is Fe, Co, or Ni), $A_{14}MSb_{11}$ (A is an alkali metal, alkali earth metal, rare-earth metal, Ga, In, or Tl; M is Fe, Co, or Ni), $Mo_3Sb_7$ (Sb is substitutable with Te up to a composition of $Mo_3Sb_5Te_2$), and $AMo_3Sb_7$ (A is Li, Cu, or Zn).

(5) In the method of manufacturing a thermoelectric material according to any one of (1) to (4), the mechanical alloying treatment may be performed for 1 to 1000 hours.

(6) In the method of manufacturing a thermoelectric material according to any one of (1) to (5), the heating and pressing may be performed at a temperature of 0.5 to 0.8 $T_m$ ($T_m$ is the melting point of the compound) and at a pressure of 10 to 300 MPa for 10 minutes to 10 hours.

(7) According to another aspect of the invention, there is provided a thermoelectric material that is obtained according to the method of manufacturing a thermoelectric material according to any one of (1) to (6).

(8) According to another aspect of the invention, there is provided a thermoelectric material that is phase-separated from a supersaturated solid solution with a composition deviated from a composition range existing in an equilibrium state of a compound.

(9) According to another aspect of the invention, there is provided a thermoelectric conversion element using the thermoelectric material according to (7) or (8).

According to the invention, a thermoelectric material with a high thermoelectric figure of merit can be manufactured.

In addition, according to the invention, a mechanical alloying treatment is performed until an X-ray peak of a starting raw material with a composition including any phase among a plurality of phases is lost, and thereby a uniform supersaturated solid solution can be manufactured.

BRIEF DESCRIPTION OF THE DRAWINGS

FIGS. 3A to 3C are XRD profiles of $Mg_{63.3}Si_{36.7}$, in which

FIGS. 4A to 4F are images showing microstructures of $Mg_{63.3}Si_{36.7}$ that are obtained by performing hot pressing (HP) after the mechanical alloying for 120 hours, in which

DETAILED DESCRIPTION OF THE INVENTION

Hereinafter, a method of manufacturing a thermoelectric material and a thermoelectric material to which the present invention is applied will be described with reference to the attached drawings.

(Method of Manufacturing Thermoelectric Material)

A method of manufacturing a thermoelectric material is a method of manufacturing a thermoelectric material including a plurality of phases that are phase-separated from a supersaturated solid solution. The method includes: a process of performing a mechanical alloying treatment a starting raw material that is prepared with a composition deviated from a composition range existing in an equilibrium state of a compound to generate the supersaturated solid solution; and a process of performing phase separation into the plurality of phases and solidification by heating and pressing the supersaturated solid solution, or by further performing a heat treatment according to the circumstances.

The "compound" in the method of manufacturing the thermoelectric material may be a line compound, but the compound is not limited thereto, and is effective for compound systems showing other phase diagrams. For example, for a material in which the higher the temperature is, the higher the solid-solubility is, or the like, a solid-solution is prepared by performing annealing at a high temperature and a precipitation structure (the precipitation is a kind of phase separation) may be applied to the solid solution by annealing the solid solution at a temperature lower than the high temperature, at which the solid-solubility is low, but the high-temperature annealing may be difficult to be performed depending on the material. That is, evaporation of components (for example, sulfides) or reaction with a sample container or the like may become problematic. In this case, the above-described method is effective as means for manufacturing a supersaturated solid solution without undergoing a high-temperature process.

In addition, for a material in which a solid-solubility is 1% (in this case, commonly, it is not referred to as a "line compound"), precipitates with a volume fraction in the order of 1% may be obtained by using a difference in solubility at a high temperature (solubility is 1%) and at a low temperature (solubility is 0%) in an equilibrium state, but the volume fraction may not be further increased. From the point of view of decreasing the lattice thermal conductivity, even in a case in which increasing the volume fraction of the precipitates is desired, this may be realized by a compulsory solid-solution according to the method of the invention.

Hereinafter, the principle of the method of manufacturing the thermoelectric material according to the invention will be described.

An A-B (pseudo) binary system including two elements (or compounds) will now be considered (FIG. 1). A solid-solubility of B into α phase is determined by a point ($c_e$) at which the common tangent between the free energy curves of the α phase and the β phase comes into contact with the free energy curve of the α phase. When B is added to the α phase, in a case where the addition makes the phase unstable, the free energy curve of the α phase becomes steep along with an increase of a concentration of B in the α phase, and therefore a low solid-solubility is shown ($c_0$ is relatively deviated to the left). The line compound is an extreme example thereof, and the $c_0$ point closes to pure A, because the free energy significantly increases with the addition of B. In general, since the contribution of an entropy term (−TS) of the free energy (G=H−TS) becomes large when the temperature is increased, the solid-solubility tends to increase, but the line compound indicates a compound that does not show an effective solid-solubility regardless of a temperature.

In this case, first, it is effective to make a material to be in a nonequilibrium state using some means. FIG. 1 shows a case in which the supersaturated solid solution state is used as the nonequilibrium state. At a composition $c_1$, a two-phase mixed state of α-β is stable as an equilibrium state, but when energy is applied to a material and the uppermost line state (nonequilibrium state) in FIG. 1 may be realized, the supersaturated solid solution (nonequilibrium state) of the α phase may be formed.

Rapid cooling solidification and mechanical alloying are known as means for realizing the nonequilibrium state of a material. In the rapid cooling solidification method, the uppermost line state (nonequilibrium state) in FIG. 1 corresponds to a state in which a melted state is quenched, that is, an amorphous state. In the mechanical alloying, the uppermost line state corresponds to a state in which a material is subjected to a large mechanical plastic deformation, or is further minutely crushed. A transition from the uppermost line state (nonequilibrium state) to the supersaturated solid solution of the α phase occurs immediately without a long range atomic diffusion. When comparing the two above-described methods, it has been known that the mechanical alloying can realize a higher-energy state than the rapid cooling solidification can. In addition, an excellent thermoelectric material generally shows a low thermal conductivity, such that in the rapid solidification method, a sufficient solidification rate may not be obtained depending on the material, and the freezing of the melted state may be difficult. Conversely, the mechanical alloying is a room-temperature process, such that a high nonequilibrium state, which is shown when mechanical energy is applied to a material, is immediately frozen after the process is terminated. Therefore, the mechanical alloying may realize a higher energy nonequilibrium state. In FIG. 1, when a material is set to enter the uppermost line state (nonequilibrium state), the supersaturated solid solution of the α phase may be realized up to the maximum composition $c_0$. The higher the energy of the uppermost line is, the wider the range of a composition in which the supersaturated solid solution may be realized is. In addition, when other material systems are considered, the higher the energy of the uppermost line, the wider the scope of material systems in which the supersaturated solid solution may be realized becomes.

A number of compound systems, which are line compounds on a phase diagram, are present also in the thermoelectric materials. In general, in these compound systems, a solid-state precipitation phenomenon from materials that are manufactured at a high temperature and have a high solute concentration can not be used, such that the nanostructure using a phase transformation is difficult. In such material systems, an increase in free energy becomes large along with an increase in solute concentration, such that it is necessary to realize a very high energy state so as to manufacture the nonequilibrium solid solution. Particularly, in this case, the nonequilibrium by the mechanical alloying of the present invention is effective. If the supersaturated solid-solution may be formed in these systems, a large chemical driving force so as to transition into an equilibrium state can be obtained, such that a significantly fine structure can be obtained.

There are, for example, $Mg_2Si$, Si—Ge, Fe—Si, Mn—Si, Cr—Si, PbTe (Te is partially or entirely substitutable with S or Se), GeTe, $AgSbTe_2$, $CoSb_3$, $AM_4Sb_{12}$ (A is an alkali metal, alkali earth metal, rare-earth metal, Ga, In, or Tl; M is Fe, Co, or Ni; Sb can be doped with Ga, In, Ge, Te, Sn, As, Se, or Bi), $Bi_2Te_3$ (Bi is partially substitutable with Sb), ZnSb, $Zn_4Sb_3$, $AZn_2Sb_2$ (A is an alkali metal, alkali earth metal, rare-earth metal, Ga, In, or Tl; M is Fe, Co, or Ni), $A_3MSb_3$ (A is an alkali metal, alkali earth metal, rare-earth metal, Ga, In, or Tl; M is Fe, Co, or Ni), $A_5M_2Sb_6$ (A is an alkali metal, alkali earth metal, rare-earth metal, Ga, In, or Tl; M is Fe, Co, or Ni), $A_{14}MSb_{11}$ (A is an alkali metal, alkali earth metal, rare-earth metal, Ga, In, or Tl; M is Fe, Co, or Ni), $Mo_3Sb_7$ (Sb is substitutable with Te up to a composition of $Mo_3Sb_5Te_2$), or $AMo_3Sb_7$ (A is Li, Cu, or Zn) as a "compound" that may be appropriately applied to the method of manufacturing the thermoelectric material according to the present invention.

Hereinafter, the method of manufacturing the thermoelectric material according to the invention will be described with $Mg_2Si$ given as an example.

Figure 2:
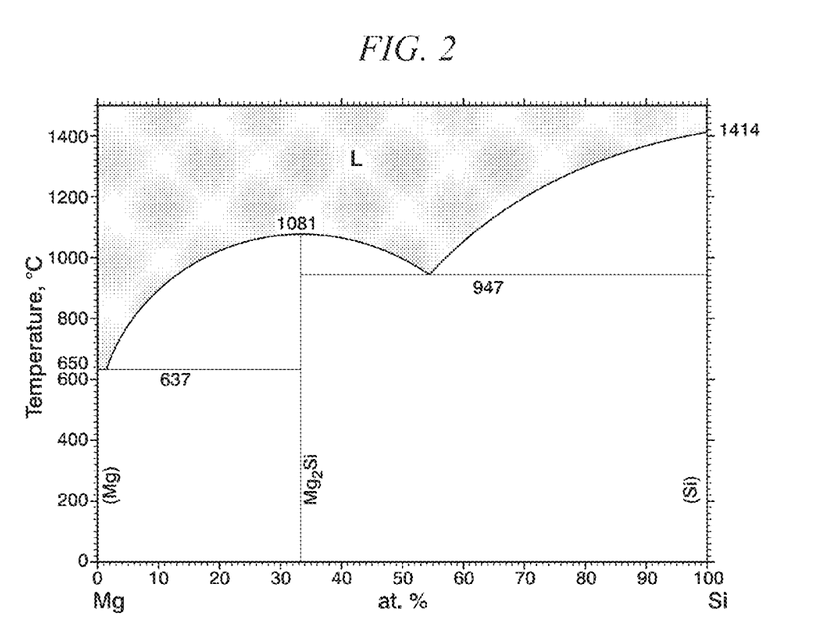
FIG. 2 is the binary equilibrium phase diagram of the Mg—Si system.

$Mg_2Si$ (magnesium silicide) has attracted much attention because of the abundance of constituent elements and the excellent thermoelectric properties. $Mg_2Si$ ($CaF_2$ type, Fm-3m) is the only stable compound in the Mg—Si binary system, and has a narrow composition range (a so-called "line compound") in the Mg—Si binary equilibrium phase diagram, and an intermediate phase is not present between $Mg_2Si$ and Si (FIG. 2). Another benefit of using the mechanical alloying for this material is in that the material does not achieve the molten state during the mechanical alloying, or a similar high energy state for an extended period of time. Thus there is no problem from high vapor pressure of magnesium during the mechanical alloying, which is often problematic in the synthesis of $Mg_2Si$ using solidification.

Samples with chemical compositions of $Mg_{66.7}Si_{33.3}$ (=$Mg_2Si$) and $Mg_{63.3}Si_{36.7}$ (with excess Si corresponding to a $(Mg_{2/3}Si_{1/3})_{0.95}Si_{0.05}$ composition) were ball milled under argon up to 120 hours using a high energy ball milling system with stainless steel vials and balls (Dual Mixer/Mill 8000D, manufactured by Spex SamplePrep, Inc.).

$Mg_{63.3}Si_{36.7}$, $Mg_2Si$ (99.99%, Alpha Aesar) and Si (99.9999%, Alpha Aesar) were used as starting materials (starting raw materials). In this case, $Mg_2Si$ and Si respectively correspond to a "compound" and an "element making up a compound". In addition, $Mg_2Si$ and Si correspond to "a starting raw material that is prepared with a composition deviated from a composition range existing in an equilibrium state of a compound". In addition, Si corresponds to "starting raw material including a component of any phase among the plurality of phases".

First, a process of "performing a mechanical alloying treatment with respect to a starting raw material that is prepared with a composition deviated from a composition range existing in an equilibrium state of a compound to generate the supersaturated solid solution" was performed.

The mechanical alloying treatment is not limited, but may be performed for 1 to 1000 hours.

Figure 3A:
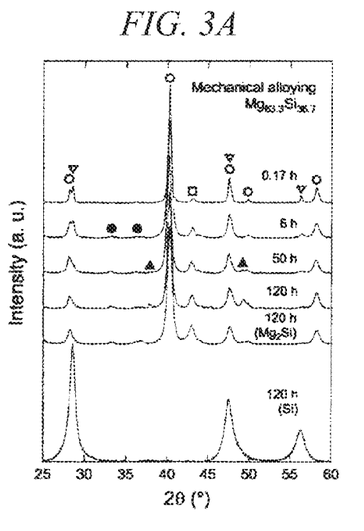
FIG. 3A is a profile after a mechanical alloying.
Figure 3B:
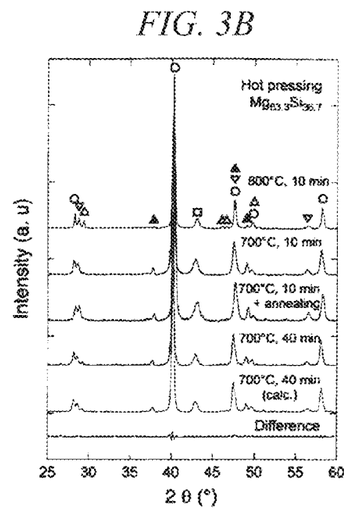
FIG. 3B is a profile after hot pressing.
Figure 3C:
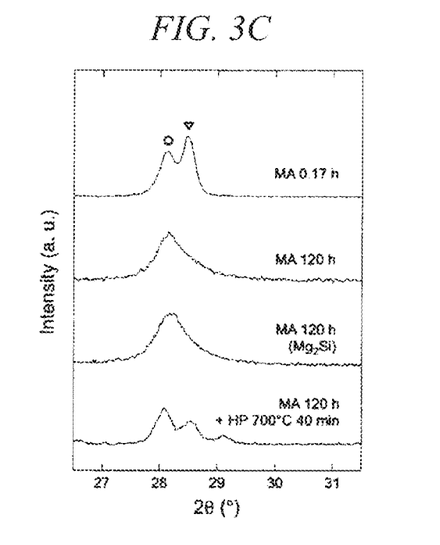
FIG. 3C is an enlarged diagram in the vicinity of the Si peak.

As can be seen from X-ray diffraction (XRD) results (FIG. 3A, after the mechanical alloying for 0.17 hours (10 minutes), powders mainly include $Mg_2Si$ ($CaF_2$ type, Fm-3m) and Si (C(cF8) type, Fd-3m). As the mechanical alloying time increases, the intensities of the X-ray peaks of silicon decrease, the X-ray peaks of silicon almost disappear (as shown in FIG. 3C after 120 hours. The performing of the mechanical alloying until the X-ray peaks of silicon (starting raw material) disappear is an example of "the mechanical alloying treatment is performed until a compulsory solid solution state of the starting raw material including a component of any phase among the plurality of phases is realized".

The disappearance of the X-ray peaks of silicon indicates that Si is solid-soluted in $Mg_2Si$, that is, a supersaturated solid solution with a composition of $Mg_{63.3}Si_{36.7}$ that is not present in the phase diagram is generated.

The XRD profile of $Mg_{63.3}Si_{36.7}$ after the mechanical alloying for 120 hours is similar to that of $Mg_{66.7}Si_{33.3}$ except for some impurity peaks which will be described later. For comparison, the mechanical alloying of Si was performed using the same experimental set up. The XRD profile of Si after 120 hours shows broadened peaks, but the diffraction angles are still consistent with the reference data of Si (FIG. 3A).

After the mechanical alloying for 120 hours, the powder was consolidated by hot pressing (HP) under an 80 MPa load by using graphite dies. That is, this process corresponds to "a process of causing a phase separation to the plurality of phases and solidification by heating and pressing the supersaturated solid solution". A detailed facility with respect to hot pressing is given elsewhere.

The temperature reaches a target point typically within 2 minutes after the heating is started. After hot pressing, the XRD peaks of Si, which are not detectable after the mechanical alloying for 120 hours, appear again under hot pressing conditions shown in FIGS. 3B and 3C. This is due to Si precipitates (nanostructure) from the supersaturated $Mg_2Si$ solid solution. That is, although observation results of the structure will be described later, the precipitation of Si occurs from the $Mg_2Si$ compound in which excess Si is compulsory solid-soluted. This precipitation of Si (the X-ray peaks of the starting materials is made to appear again) is an example of "the phase separation from the solid solution state is caused by the heating and pressing or by further an additional heat treatment according to circumstances".

In addition, in hot pressing (heating and pressing), conditions are set in such a manner that the nanostructure is not coarsened too much while obtaining high density. Therefore, it is preferable that the conditions be set to a relatively low temperature (so as to avoid the coarsening of the nanostructure) for a short time, and a relatively high pressure (so as to obtain the high density regardless of the relatively low temperature and short time). Although not limited, hot pressing (heating and pressing) may be performed at a temperature of 0.5 to 0.8 $T_m$ ($T_m$ is the melting point of the component) and at a pressure of 10 to 300 MPa for 10 minutes to 10 hours. In the case of $Mg_2Si$, hot pressing is performed frequently in the order of 0.5 to (0.7 to 0.8) $T_m$ and in the order of 40 MPa, but from a point of view of setting the conditions to the relatively low temperature and short time (so as to avoid the coarsening of the nanostructure) and the relatively high pressure (so as to obtain the high density regardless of the relatively low temperature and short time), it is preferable that hot pressing be performed at a temperature of 0.5 to 0.7 $T_m$ and at a pressure of 40 to 300 MPa.

The samples are partially oxidized to produce MgO (NaCl type, Fm-3m), and the peak intensities of the XRD increase with the increase of the mechanical alloying time reflecting the increase in the surface area of $Mg_2Si$ per volume. After the mechanical alloying for 50 hours, the XRD peaks appear around 38° and 49°. These peaks can be identified as $FeSi_2$ ($FeSi_2$ type, P4/mmm). The origin of iron is considered to be a stainless steel vials and balls used in the mechanical alloying. According to the equilibrium phase diagram of the Fe—Si system, a tetragonal P4/mmm phase is stable only at high temperatures above 962° C. The formation of this metastable phase is a further example of a capability of the mechanical alloying to produce metastable phases. In addition, after 6 hours in the mechanical alloying, there are small features around 33° and 36°. These are considered to be from a metastable $Mg_2Si$ (hexagonal, $P6_3$/m), which can exist under a high pressure of 6 GPa or more. A similar metastable phase, $Mg_2Ge$ (hexagonal, $P6_3$/m), which has the same crystal structure as $Mg_2Si$, has been observed in the mechanical alloying of the Mg—Ge system. After the HP, the peaks from $FeSi_2$ (orthorhombic, Cmca), which is stable phase at room temperature, were observed as well as the peaks from the metastable $FeSi_2$ ($FeSi_2$ type, P4/mmm). The peaks from the metastable $Mg_2Si$ formed during the mechanical alloying disappeared during the HP. Thus several metastable phases appear due to the mechanical alloying that transform to the stable phases during the HP.

FIGS. 4A to 4F show microstructures observed by a field emission-scanning electron microscope (FE-SEM, Carl Zeiss LEO 1550 VP) and a transmission electron microscope (TEM, FEI TF30UT (300 kV)) after the consolidation of the $Mg_{63.3}Si_{36.7}$ powders (mechanical alloying for 120 hours) by hot pressing. Bright particles are dispersed in the entire samples after the HP. The fine particles are considered as Si or $FeSi_2$, since they are bright in back scattered electron images (the small inset in FIG. 4A. The size of the particles in the hot pressing at 800° C. for 10 minutes is larger than that in hot pressing at 700° C. for 10 minutes (FIG. 4A) and hot pressing at 700° C. for 40 minutes (FIG. 4C) due to the coarsening of the crystal grains or a small nucleation rate of the precipitates. The EDS analysis performed using TEM samples (700° C., 40 minutes) shows that chemical compositions of the bright particles in Z-contrast images (FIG. 4F) are either rich in Si or both Si and Fe.

To evaluate weight fractions of phases after the HP, the XRD profiles (hot pressing at 700° C. for 40 minutes) were refined by Rietveld method for both $Mg_{66.7}Si_{33.3}$ and $Mg_{63.3}Si_{36.7}$. The resulting weight fractions and calculated profile were shown in Table 1 and FIG. 3B for $Mg_{63.3}Si_{36.7}$, respectively. The measured XRD profiles were reproduced well with $Mg_2Si$ ($CaF_2$ type, Fm-3m), MgO (NaCl type, Fm-3m), Si (C(cF8) type, Fd-3m), $FeSi_2$ peak (orthorhombic, Cmca), and $FeSi_2$ ($FeSi_2$ type, P4/mmm). The weight fraction of Si in $Mg_{63.3}Si_{36.7}$ is evaluated to be more than that in $Mg_{66.7}Si_{33.3}$, which is qualitatively consistent with the initial composition. It should be noted that one needs to be cautious about the weight fractions estimated here since the microstructure size after hot pressing is so fine that the intensities of nanoscale phases may be underestimated.

Table 1 shows weight fractions of phases in the samples hot pressed at 700° C. for 40 minutes, which was evaluated by the Rietveld refinement.

TABLE 1

| Phase | Crystal structure | $Mg_{66.7}Si_{33.3}$ | | $Mg_{63.3}Si_{36.7}$ | |
| --- | --- | --- | --- | --- | --- |
| | | Loaded (%) | After MA plus HP (%) | Loaded (%) | After MA plus HP (%) |
| $Mg_2Si$ | $CaF_2$ type, Fm-3m | 100 | 88.7 | 94.5 | 82.2 |
| MgO | NaCl type, Fm-3m | 0 | 9.7 | 0 | 7.3 |
| Si | C(cF8) type, Fd-3m | 0 | 1.4 | 5.5 | 5.6 |
| $Fe_2Si$ | Orthorhombic, Cmca | 0 | 0.22 | 0 | 1.1 |
| $Fe_2Si$ (Metastable) | $FeSi_2$ type, P4/mmm | 0 | 0 | 0 | 3.8 |

A lattice parameter of $Mg_2Si$ phase in $Mg_{63.3}Si_{36.7}$ after the HP (at 700° C. for 40 minutes) evaluated by the Rietveld refinement, 6.357 Å, is similar to that in $Mg_{66.7}Si_{33.3}$, 6.354 Å. On the other hand, lattice parameters after the mechanical alloying are 6.359 Å and 6.367 Å for $Mg_{66.7}Si_{33.3}$ and $Mg_{63.3}Si_{36.7}$, respectively. In regard to the large lattice parameter of $Mg_2Si$ in $Mg_{63.3}Si_{36.7}$ after the mechanical alloying, this may be explained due to the excess Si atoms occupying interstitial sites suggesting the formation of the $Mg_2Si$ solid-solution by the mechanical alloying.

Figure 4:
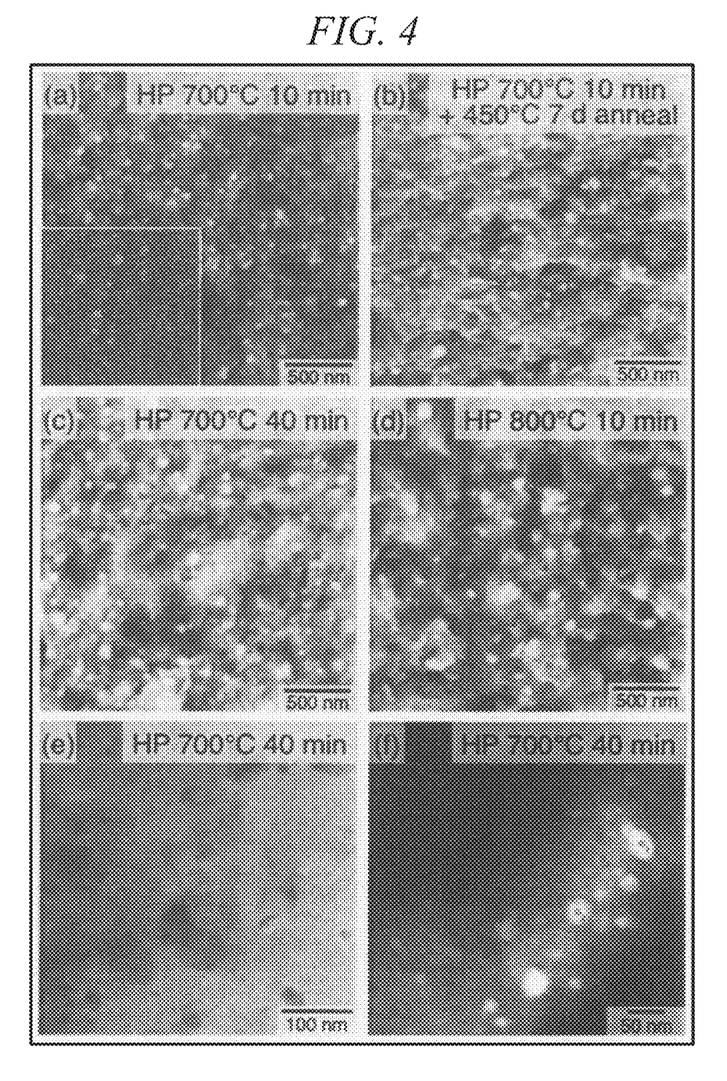
FIG. 4A is an FE-SEM image obtained by performing the HP at 700° C. for 10 minutes.
FIG.4B is an FE-SEM image obtained by performing a heat treatment at 450° C. for 7 days after performing the HP at 700° C. for 10 minutes.
FIG.4C is an FE-SEM image obtained by performing the HP at 700° C. for 40 minutes.
FIG. 4D is an FE-SEM image obtained by performing the HP at 800° C. for 40 minutes.
FIG. 4E is a TEM image obtained by performing the HP at 700° C. for 40 minutes.
FIG. 4F is a Z-contrast image obtained by performing the HP at 700° C. for 40 minutes.
Figure 5:
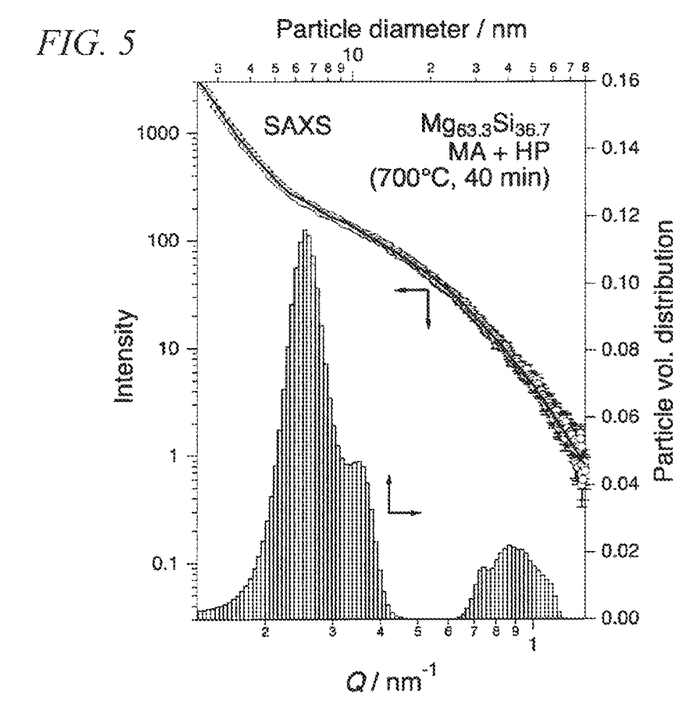
FIG. 5 is a view illustrating the net intensity of small-angle X-ray scattering and particle size distribution of $Mg_{63.3}Si_{36.7}$ that is subjected to hot pressing at 700° C. for 40 minutes after performing the mechanical alloying for 120 hours.

In principle, TEM observation is performed only on a limited area of the sample with a poorly characterized thickness. In order to obtain average information on the size of the particles dispersed in the sample, a small angle X-ray scattering experiment was carried out on the hot pressed sample (700° C. for 40 minutes). In order to obtain the net intensity of the small angle X-ray scattering from the fine nanoparticles, the intensity from the $Mg_{66.7}Si_{33.3}$ sample (hot pressed at 700° C. for 40 minutes) was subtracted from the intensity from the $Mg_{63.3}Si_{36.7}$ sample. Small angle X-ray scattering (SAXS) measurements were performed on a custom-made apparatus by using a XENOCS Genix microfocus X-ray source (wavelength: 1.54 Å), a scatterless slit beam collimation system and a Mar345 image plate area detector. Samples were thinned to 20 μm to allow the transmission SAXS measurement to be performed. The diffraction data was azimuthally averaged to generate the 1D intensity data for analysis. The net intensity and the resulted distribution of the particle size are shown in FIG. 5. The intensity profile was analyzed by the maximum entropy method, where the regularization method was added to the original maximum entropy method, using the Irena software package. The particle morphology was assumed to be spherical. Since the concentrations of MgO in $Mg_2Si$ and $Mg_{63.3}Si_{36.7}$ can be supposed to be similar, the difference in intensity largely reflects the scattering from the Si and $FeSi_2$ nanoparticles. The distribution of the particle diameter obtained by this analysis is bymodal peaks around ~7 nm, and ~40 nm. These diameters are consistent with the TEM observations (FIG. 4).

Finally, to examine the stability of the microstructure, the sample after hot pressing (700° C. for 40 minutes) was annealed at 450° C., which is supposed to be within the range of application temperature of $Mg_2Si$ for thermoelectric generator devices for seven days. The microstructure appears to be similar to that before annealing as shown in FIG. 4B suggesting the microstructure is stable at this temperature.

In summary, the mechanical alloying procedure for a long time (120 hours) using a high energy ball milling eliminates the XRD peaks from the excess Si at the $Mg_{63.3}Si_{36.7}$ composition in the pseudo-binary $Mg_2Si$—Si system. This is considered to be attributed to the formation of the $Mg_2Si$ supersaturated solid-solution. The $Mg_{63.3}Si_{36.7}$ samples consolidated by the hot pressing show the microstructure with the Si and $FeSi_2$ nanoparticles (from reaction with the steel container), which have particle diameters peaking around 7 nm and 40 nm. The formation of the Si nanoparticles (phases) is explained by the precipitation from the $Mg_2Si$ solid-solution supersaturated with silicon. The equilibrium $Mg_2Si$ phase in the Mg—Si system shows no detectable composition range that is deviated from a stoichiometric composition. This suggests that the deviation in composition from the stoichiometric composition leads to a steep increase in free energy. Therefore, if the energetically unfavorable solid-solution is realized by a high energy process, i.e., the mechanical alloying, the driving force for the transformation to the equilibrium state, $Mg_2Si$ plus Si, is expected to be large.

Figure 6:
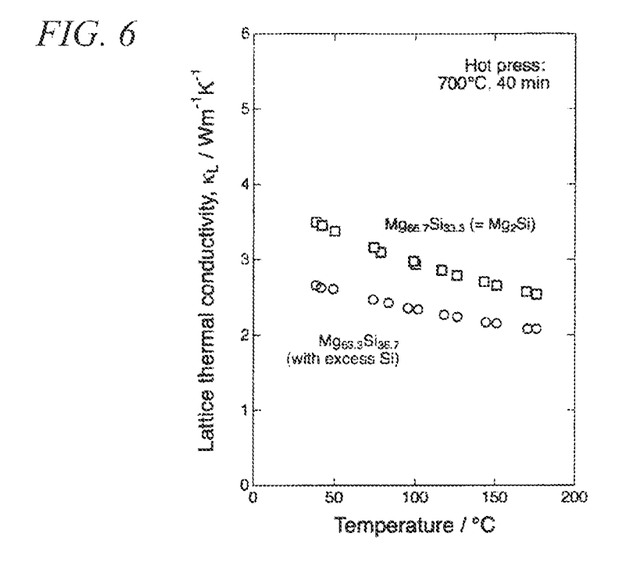
FIG. 6 is a view illustrating lattice thermal conductivities of samples having compositions of $Mg_{66.7}Si_{33.3}(=Mg_2Si)$ and $Mg_{63.3}Si_{36.7}$ with excess Si) that are subjected to hot pressing at 700° C. for 40 minutes after performing the mechanical alloying for 20 hours.

FIG. 6 shows lattice thermal conductivities of samples having compositions of $Mg_{66.7}Si_{33.3}$ (=$Mg_2Si$) and $Mg_{63.3}Si_{36.7}$ (with excess Si) that are subjected to hot pressing at 700° C. for 40 minutes after performing the mechanical alloying for 120 hours. The lattice thermal conductivity in a composition with excess silicon is lower than that in a stoichiometric composition. As shown in FIG. 4C, the sample with excess silicon has a microstructure having fine silicon nanoprecipitates (nanostructures), but the sample with the stoichiometric composition has no microstructure. The above-described experiment results demonstrate that the nanoprecipitates formed in hot pressing through the nonequilibrium state occurring due to the mechanical alloying for a long time actually decreases the lattice thermal conductivity of the thermoelectric material, $Mg_2Si$.

(Thermoelectric Material)

The thermoelectric material according to the invention is a thermoelectric material that is phase-separated from a supersaturated solid solution with a composition deviated from a composition range existing in an equilibrium state of a compound.

Specifically, a PbTe—$Ag_2Te$ pseudo-binary system of or the above-described $Mg_2Si$—Si are examples of that.

In ranges up to the maximum solid-solubility of $Ag_2Te$ to PbTe and the maximum solid-solubility of PbTe to $Ag_2Te$, a solid-solution may be produced by a usual heat treatment (holding at a high temperature). Then, the phase separation (precipitation) may be caused by performing a re-heat-treatment in a low temperature range in which the solid-solubility is low. However, in an intermediate composition range, the solid-solution may not be produced by the usual heat treatment. Conversely, when the mechanical alloying treatment is used, the solid-solution may be produced in this composition range. When this solid-solution is subjected to a heat treatment, a nanostructure through a phase separation may be obtained. Therefore, a volume fraction of parent phase/precipitate phase of a selectable nanostructure may be extended compared to that in the usual heat treatment.

In addition, in the $Mg_2Si$—Si phase diagram shown in FIG. 2, since none of them are dissolved together (line compound) regardless of the temperature, the solid solution may not be produced by the usual heat treatment. That is, in this system, a "range in which the solid-solution may be produced by the usual heat treatment" in an example of PbTe—$Ag_2Te$ does not exist, the entire composition ranges of $Mg_2Si$—Si correspond to "composition ranges in which a compulsory solid-solution may be produced by the mechanical alloying". After producing the compulsory solid-solution, a structure of $Mg_2Si$ (parent phase)-Si (precipitate) may be obtained.

A thermoelectric material, which has a phase separation structure with an impossible combination of phases under the equilibrium phase diagram, may be produced by the mechanical alloying treatment and heat pressing (additional heat treatment according to the circumstances).

(Thermoelectric Conversion Element)

The thermoelectric conversion element (thermoelectric element, thermoelectric device) according to the invention is an element capable of performing conversion between thermal energy and electric energy, and may be produced by using the thermoelectric material of the invention as a material capable of performing the conversion between the thermal energy and the electric energy.

The thermoelectric material, which is manufactured by a method of manufacturing a thermoelectric material of the present invention, and the thermoelectric conversion element may be used, for example, in a cooler (a small-size refrigerator in consumer use, a small-size cooler for medical use or experimental use in industrial use, or the like), and a generator (vehicle, a generator using industrial waste heat, a generator that is assembled in cogeneration, an atomic battery used for space development, or the like).

The invention claimed is:

1. A method of manufacturing a thermoelectric material including a plurality of phases that are phase-separated from a supersaturated solid solution, the method comprising:
   a process of performing a mechanical alloying treatment to a starting raw material that is prepared with a composition deviated from a composition range existing in an equilibrium state of a compound to generate the supersaturated solid solution; and
   a process of causing a phase separation to the plurality of phases and solidification by heating and pressing the supersaturated solid solution, or by further performing a heat treatment to the supersaturated solid solution according to circumstances.

2. The method according to claim 1,
   wherein the mechanical alloying treatment is performed until a compulsory solid solution state of the starting raw material including a component of any phase among the plurality of phases is realized.

3. The method according to claim 1,
   wherein the compound is any one selected from a group consisting of $Mg_2Si$, Si—Ge, Fe—Si, Mn—Si, Cr—Si, PbTe (Te is partially or entirely substitutable with S or Se), GeTe, $AgSbTe_2$, $CoSb_3$, $AM_4Sb_{12}$ (A is an alkali metal, alkali earth metal, rare-earth metal, Ga, In, or Tl; M is Fe, Co, or Ni; Sb can be doped with Ga, In, Ge, Te, Sn, As, Se, or Bi), Bi2Te3 (Bi is partially substitutable with Sb), ZnSb, Zn4Sb3, $AZn_2Sb_2$ (A is an alkali metal, alkali earth metal, rare-earth metal, Ga, In, or Tl; M is Fe, Co, or Ni), A3MSb3 (A is an alkali metal, alkali earth metal, rare-earth metal, Ga, In, or Tl; M is Fe, Co, or Ni), $A_5M_2Sb_6$ (A is an alkali metal, alkali earth metal, rare-earth metal, Ga, In, or Tl; M is Fe, Co, or Ni), $A_{14}MSb_{11}$ (A is an alkali metal, alkali earth metal, rare-earth metal, Ga, In, or Tl; M is Fe, Co, or Ni), $Mo_3Sb_7$ (Sb is substitutable with Te up to a composition of Mo3Sb5Te2), and $AMo_3Sb_7$ (A is Li, Cu, or Zn).

4. The method according to claim 1,
   wherein the mechanical alloying treatment is performed for 1 to 1000 hours.

5. The method according claim 1,
   wherein the heating and pressing is performed at a temperature of 0.5 to 0.8 Tm (Tm is the melting point of the compound) and at a pressure of 10 to 300 MPa for 10 minutes to 10 hours.

* * * * *